(12) United States Patent
Costa

(10) Patent No.: US 9,019,010 B2
(45) Date of Patent: Apr. 28, 2015

(54) INTEGRATED STACKED POWER AMPLIFIER AND RF SWITCH ARCHITECTURE

(71) Applicant: RF Micro Devices, Inc., Greensboro, NC (US)

(72) Inventor: Julio Costa, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 162 days.

(21) Appl. No.: 13/900,077

(22) Filed: May 22, 2013

(65) Prior Publication Data

US 2013/0314163 A1 Nov. 28, 2013

Related U.S. Application Data

(60) Provisional application No. 61/650,052, filed on May 22, 2012.

(51) Int. Cl.
| | |
|---|---|
| H03F 3/68 | (2006.01) |
| H03F 3/191 | (2006.01) |
| H03F 3/193 | (2006.01) |
| H03F 3/21 | (2006.01) |
| H03F 3/24 | (2006.01) |
| H04B 1/00 | (2006.01) |

(52) U.S. Cl.
CPC .............. *H03F 3/193* (2013.01); *H03F 3/191* (2013.01); *H03F 3/211* (2013.01); *H03F 3/245* (2013.01); *H03F 2200/111* (2013.01); *H03F 2200/318* (2013.01); *H03F 2200/408* (2013.01); *H03F 2203/21157* (2013.01); *H04B 1/0057* (2013.01)

(58) Field of Classification Search
USPC ........................................ 330/295, 53, 124 R
IPC .......................................................... H03F 3/68
See application file for complete search history.

(56) References Cited

U.S. PATENT DOCUMENTS 3,513,404 A * 5/1970 Howe et al. ........................ 330/9
4,439,744 A * 3/1984 Kumar et al. ................. 330/285
(Continued)

OTHER PUBLICATIONS

Pornpromlikit, Sataporn et al., "A Watt-Level Stacked-FET Linear Power Amplifier in Silicon-on-Insulator CMOS," IEEE Transactions on Microwave Theory and Techniques, Jan. 2010, p. 57-64, vol. 58, No. 1.
(Continued)

*Primary Examiner* — Patricia Nguyen
(74) *Attorney, Agent, or Firm* — Withrow & Terranova, P.L.L.C.

(57) ABSTRACT

Combination circuitry includes a relatively small preamplifier and includes hybrid circuitry. The hybrid circuitry is configured to perform mode switching while also performing some amplification, thus allowing the relatively small preamplifier to be smaller than a conventional power amplifier. In one embodiment, the hybrid circuitry includes first series portion configured to amplify when ON, a first shunt portion, a second series portion configured to amplify when ON, and a second shunt portion. The first series portion may include: a first transistor; a first variable impedance in communication with a gate of the first transistor, wherein the first variable impedance is configured to receive a first transistor control signal; a second transistor in series with the first transistor; and a second variable impedance in communication with a gate of the second transistor, wherein second variable impedance is configured to receive a second transistor control signal.

20 Claims, 3 Drawing Sheets

(56) References Cited

U.S. PATENT DOCUMENTS

| | | | | |
|---|---|---|---|---|
| 4,901,032 | A | * | 2/1990 | Komiak .................. 330/277 |
| 5,008,633 | A | * | 4/1991 | Hom ..................... 330/277 |
| 5,994,965 | A | * | 11/1999 | Davis et al. ............. 330/295 |
| 6,735,421 | B1 | * | 5/2004 | Claxton et al. ........... 455/207 |
| 8,559,907 | B2 | * | 10/2013 | Burgener et al. ......... 455/333 |

OTHER PUBLICATIONS

Shifrin, M. et al., "A New Power Amplifier Topology with Series Biasing and Power Combining of Transistors," IEEE 1992 Microwave and Millimeter-Wave Monolithic Circuits Symposium, Jun. 1-3, 1992, p. 39-41.

* cited by examiner

INTEGRATED STACKED POWER AMPLIFIER AND RF SWITCH ARCHITECTURE

RELATED APPLICATIONS

This application claims the benefit of provisional patent application Ser. No. 61/650,052, filed May 22, 2012, the disclosure of which is hereby incorporated herein by reference in its entirety.

FIELD OF THE DISCLOSURE

The field of the disclosure is circuitry including power amplifier and a mode switch for telecommunications. Specifically, hybrid circuitry is configured to perform mode switching while also performing some amplification, thus allowing an associated pre-amplifier to be smaller than a conventional power amplifier.

In other words, the present disclosure relates to circuitry that utilizes power amplification by using a Stacked-FET transistor arrangement, in contrast to the more traditional method of paralleling a lot of transistors in a conventional power amplifier. Additionally, when such a stacked FET arrangement is used for the power amplifier, these same stacked FET elements can be biased to operate as an RF switch element (while simultaneously providing amplification while the RF switch element is ON).

BACKGROUND

In conventional telecommunications, discrete circuits perform discrete duties and are non-overlapping. Power amplification is performed solely by a power amplifier, and switching is performed solely by a mode switch.

FIG. 1 illustrates a high level conventional combination of a power amplifier and a mode switch in a 3G (third generation) radiofrequency chain of a cellular handset. FIG. 1 conveys the main elements of the conventional implementation and will serve to differentiate the concepts of the present disclosure, which will be demonstrated later.

In FIG. 1 (from left to right), power amplifiers (PA1 and PA2) feed into mode switches (SW1 and SW2 respectively); the mode switches feed into duplexers (D1, D2, D8, or D5); the duplexers feed into a selector switch (SW3); and the selector switch selectively feeds into an antenna ANT.

The top half of FIG. 1 is associated with high band transmissions. Specifically, power amplifier PA1 amplifies the power of a high band (HB) wide band code division multiple access (WCDMA) signal VHBIN, and outputs VHBOUT.

As shown in the top half of FIG. 1, VHBOUT is transmitted (without amplification) through mode switch SW1, duplexer D1 (for transmissions in band 1), selector switch SW3, and finally to antenna ANT. Duplexer D1 may perform some filtering. Duplexer D2 (for transmissions in band 2) is not currently selected.

Similarly, as shown in the bottom half of FIG. 1, VLBOUT is transmitted (without amplification) through mode switch SW2, duplexer D8 (for band 8), and is received by selector switch SW3. Duplexer D8 may perform some filtering. Duplexer D5 (for band 5) is not currently selected.

If selector switch SW3 selected the duplexer D8 (this selection is not shown), then VLBOUT would be transmitted in band 8 (without amplification) to the antenna ANT.

In FIG. 1, there are two WCDMA Power Amplifiers, one for High Band (PA1) and one for Low Band (PA2). Low Band typically refers to the cellular frequency bands in the 0.7-1.0 GHz range, and High Band generally implies operation in the 1700-2100 GHz range, although many different frequency bands are being proposed in next generation cellular systems. Each one of these PA outputs (VHBOUT and VLBOUT respectively) is then routed to a Mode Switch (SW1 and SW2 respectively), which is then routed to the appropriate TX/RX duplexer. For each WCDMA band supported, there will typically be a throw or position in the mode switch so that its TX signal can be routed to the appropriate duplexer and directed to the handset antenna. Although FIG. 1 shows only 4 WCDMA bands (two LOW Bands #5 and 8# and two High Bands #1 and #2), modern smart handsets with 10 or more frequency bands have already been launched or are in the process of being developed.

If one were to focus on the Power Amplifier (PA1 and PA2) and Mode Switch (SW1 and SW2) components, at the transistor level, one would typically encounter the arrangement shown below in FIG. 2. The conventional implementation of the 3G PA followed by a mode switch depicted in FIG. 2 shows many of the traditional concepts known to those skilled in the RF cellular design area. Several results of this conventional implementation are noted below since they will be later contrasted with the concepts of the present disclosure.

FIG. 2 illustrates a transistor level implementation of a conventional combination of a power amplifier PA1 (matched to 50 ohms) and a mode switch SW1 in a 3G (third generation) radiofrequency chain of a cellular handset.

In FIG. 2, power amplifier PA1 receives signal VHBIN and outputs fully amplified signal VHBOUT. Specifically, power amplifier PA1 includes input matching network N4, transistor T2, interstage matching network N6, transistor T4, and output matching network N8 in series. DC controller and biasing network N2 receives control lines CL1 and receives voltage VBATTERY. The input impedance Z2 to power amplifier PA1 is matched at 50 ohms. The output impedance Z6 for power amplifier PA1 is 50 ohms. The output impedance of the second transistor T4 is Z4, and is typically 2 to 4 ohms for a large second transistor T4.

Power amplifier PA1 may amplify from 30 to 32 dB, and output matching network N8 may lose approximately 20% of the power required to operate power amplifier PA1. Thus, this power amplifier PA1 is very lossy.

Mode switch SW1 acts as a simple switch, receives fully amplified signal VHBOUT, and transmits VHBOUT (without additional amplification) towards either duplexer D1 (as signal TX_B1 for band1) or towards duplexer D2 (as signal TX_B2 for band2), depending upon which mode (band1 or band2) has been selected (D1 and D2 are shown in FIG. 1).

Mode switch SW1 includes a first series portion Series_1, a first shunt portion Shunt_1, a second series portion Series_2, a second shunt portion Shunt_2, and a DC bias controller and biasing network N10.

The first series portion receives VHBOUT and outputs TX_B1. The first series portion includes a series of transistors (T10, T12, and T14) with gates connected to gate voltage VGseries_Port1, and with bodies connected to a body voltage VBseries_1.

The first shunt portion Shunt_1 includes a series of transistors (T20, T22, and T24) with gates connected to VGshunt_Port1, and with bodies connected to VBshunt_Port1.

The second series portion receives VHBOUT and outputs TX_B2. The second series portion includes a series of transistors (T30, T32, and T34) with gates connected to VGseries_Port2 and with bodies connected to VBseries_Port2.

Second shunt portion Shunt_2 includes a series of transistors (T40, T42, and T44) with gates connected to VGshunt_Port2 and with bodies connected to VBshunt_Port2.

Mode switch SW1 is a two mode switch, configured to switch VHBOUT to a first band (band1) or to a second band (band2).

If the first band (band1) is selected, then VHBOUT is switched to first band (band1) at TX_B1 with low impedance (but with no amplification). The first series portion series_1 is ON, the first shunt portion shunt_1 is OFF (isolating TX_B1 from ground), the second series portion series_2 is OFF (isolating TX_B2 from VHBOUT), and the second shunt portion shunt_2 is ON.

Specifically, the first series portion series_1 is ON (closed circuited, with gate voltage VGseries_Port set to +2.5V, with body voltage VBseries_Port1 set to 0V, and with an impedance of approximately 0.5V), and the first shunt portion shunt_1 is OFF (open circuited, with a gate voltage VGshunt_Port1 of −2.5V, with a body voltage VBshunt_Port1 set to −2.5V, and with a high impedance). Further, the second series portion series_2 is OFF (open circuited, with gate voltage VGseries_Port2 set to −2.5V, with body voltage VBseries_Port2 set to −2.5V, and with high impedance). The second shunt portion shunt_2 is ON (short circuited, with gate voltage VGshunt_Port2 set to +2.5V, with body voltage VBshunt_Port2 set to 0V, and with low impedance).

If the second band (band2) is selected by mode switch SW1, then VHBOUT is switched to a second band (band2) at TX_B2. Further, the states of the four portions are the opposite of what they were when the first band was selected. Thus, the first series portion series_1 is OFF, the first shunt portion shunt_1 is ON, the second series portion series_2 is ON, and the second shunt portion shunt_2 is OFF.

In FIG. 2, the power amplifier PA1 is implemented with a dual stage HBT (heterojunction bipolar transistor) device technology (see NPN bipolar transistors T2 and T4). Traditionally GaAs or silicon HBTs devices are employed in the industry, although GaAs and silicon FETs can also be used for this function. The final stage of the HBT section shown is typically built with a very large RF power device T4. Typically for a 3G WCDMA application, emitter areas of 4000-8000 μm² are used for T4, which cause the output impedance Z4 of the HBT transistor T4 device to be very low, typically in the range of 2-4 Ohms.

In the conventional implementation of FIG. 2, Output Matching Network N8 of power amplifier PA1 must convert the output impedance of the HBT T4 as discussed above to a value close to 50 Ohms in the band of operation of power amplifier PA1. Because this impedance transformation is very large (typically 2 ohms transformed to 50 ohms) and needs to occur over a large range of frequencies where the power amplifier PA1 is supposed to operate, the Output Matching Network N8 ends up incurring unnecessary loss and complexity, especially when one considers that such match must also support harmonic terminations and other networks needed for amplifier stability. It would indeed be much more desirable to have the output impedance of the final stage of the device T4 be much closer to 50 Ohms for ease of matching and minimization of loss and stability.

Mode switch SW1 is shown in FIG. 2 implemented with SOI CMOS technology, although other FET technologies such as GaAs PHEMTs, bulk CMOS, etc., could be used.

In FIG. 2, the input terminal of the mode switch SW1 must be able to reliably withstand the largest output power generated by the power amplifier PA1. Those skilled in the design of RF power switches recognize that multiple SOI FETs connected in series with a stacking number are needed to provide reliable switch operation for a given power level. For cellular handset power levels, one typically stacks 12-14 NFET devices of 0.25 um in series, as an example.

In FIG. 2, shunt portions Shunt_1 and Shunt_2 are placed at the output terminals (TX_B1 and TX_B2) of mode switch SW1 to provide the required port-to-port isolation. The shunt portions must also be stacked as well so as to provide the required isolation.

In FIG. 2, the gate and body voltages of the different mode switch portions are controlled by a controller network N10 (internal or external) so as to provide the required voltage levels according to the mode in which the switch needs to operate.

In FIG. 2, the large number of FETs required for the handling of the RF power levels creates high loss due to the composite ON resistance of the branches that are turned ON, due to the parasitic effects of the other FETs which are turned OFF, and due to the impedance mismatch that the mode switch SW1 inserts between the power amplifier PA1 and the ports TX_B1 and TX_B2.

In summary, the conventional implementation of a power amplifier PA1 and a mode switch SW1 is inefficient because the series portions in the mode switch only serve as switches, and do not amplify. Further, the power amplifier PA1 must be very large and must provide all of the amplification. Also, every transistor in each series portion must be sized to handle the maximum power from power amplifier PA1.

The usage of some of the elements of a stacked FET amplifier and integration in a single or a multi branch switch are particularly beneficial, and are described in further detail below. Several of the benefits of this architecture will be described below and contrasted with the conventional approaches in typical RF amplifier/switch arrangements used in the RF applications such as cellular handsets or Wi-Fi routers.

SUMMARY

The present disclosure relates to combination circuitry including a relatively small preamplifier and hybrid circuitry. The combination circuitry replaces the conventional amplifier and mode switch.

The hybrid circuitry is configured to perform mode switching while also performing some amplification, thus allowing the relatively small preamplifier to be smaller than a conventional power amplifier. The combination circuitry replaces a conventional power amplifier and a conventional mode switch.

In one embodiment, the hybrid circuitry includes first series portion configured to amplify, a first shunt portion, a second series portion, and a second shunt portion configured to amplify. The first series portion may include: a first transistor; a first variable impedance in communication with a gate of the first transistor, wherein the first variable impedance is configured to receive a first transistor control signal; a second transistor in series with the first transistor; and a second variable impedance in communication with a gate of the second transistor, wherein second variable impedance is configured to receive a second transistor control signal.

The combination circuitry may be an integrated component on a single die, or may be a preamplifier on a first die and hybrid circuitry on a second die. This combination circuitry architecture may circumvent certain problems pointed out above and described in association with FIG. 2.

In one embodiment, FET devices (or other solid state devices) in a mode switch may themselves be used as amplification elements and operate in tandem with a relatively small preamplifier (or modified power amplifier final stage) to yield combination circuitry that provides the exact same functionality of the conventional implementation (amplifier and mode switch) shown in FIG. 1. This combination circuitry (including a preamplifier and hybrid circuitry) reduces losses and reduces footprint with respect to the conventional circuitry.

In essence, in a conventional switch implementation, the FETs (which have a very large periphery and area) are only used in low resistance mode in the ON state (short circuit), and in the high impedance mode in the OFF state (open circuit). Further, the amplifier must perform all of the amplification.

Theoretically and with some modifications, these mode switch branch FETs may be used as a voltage amplifying element (if properly biased). Hence, NFET elements (for example) may simultaneously serve the function of being part of the ON branch of a mode switch, and also serve as an amplification device (contributing to the small amplification from the preamplifier). This hybrid circuitry reduces the active area dramatically and reduces the loss that normally would be incurred with the mode switch. Further, this hybrid circuitry facilitates the use of a relatively small preamplifier, in contrast to a full sized amplifier.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 3:
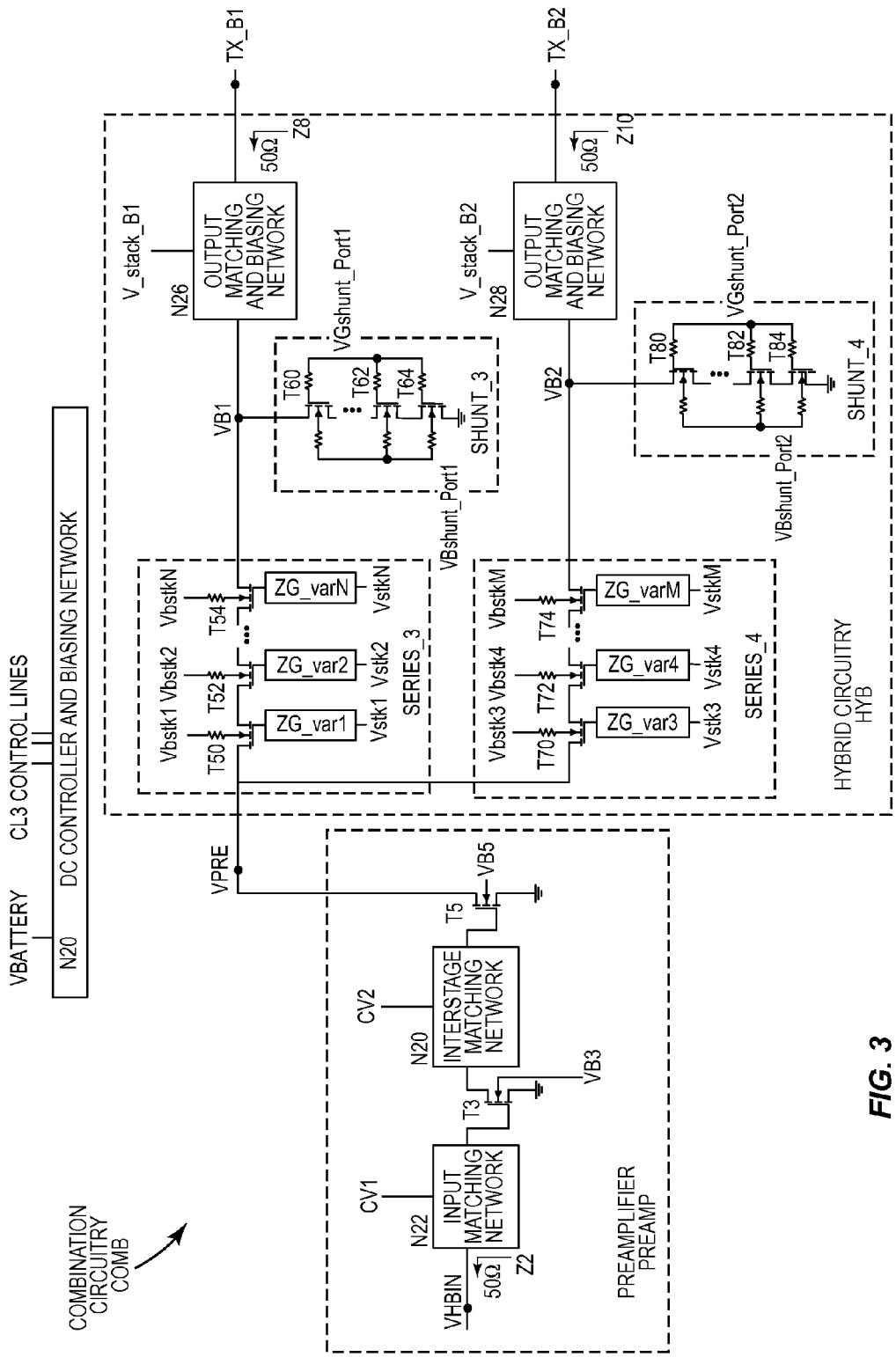
FIG. 3 illustrates combination circuitry COMB including a preamplifier PREAMP, hybrid circuitry HYB, and DC Controller and Biasing Network N20.

FIG. 3 illustrates combination circuitry COMB including a preamplifier PREAMP, hybrid circuitry HYB, and DC Controller and Biasing Network N20.

Figure 1:
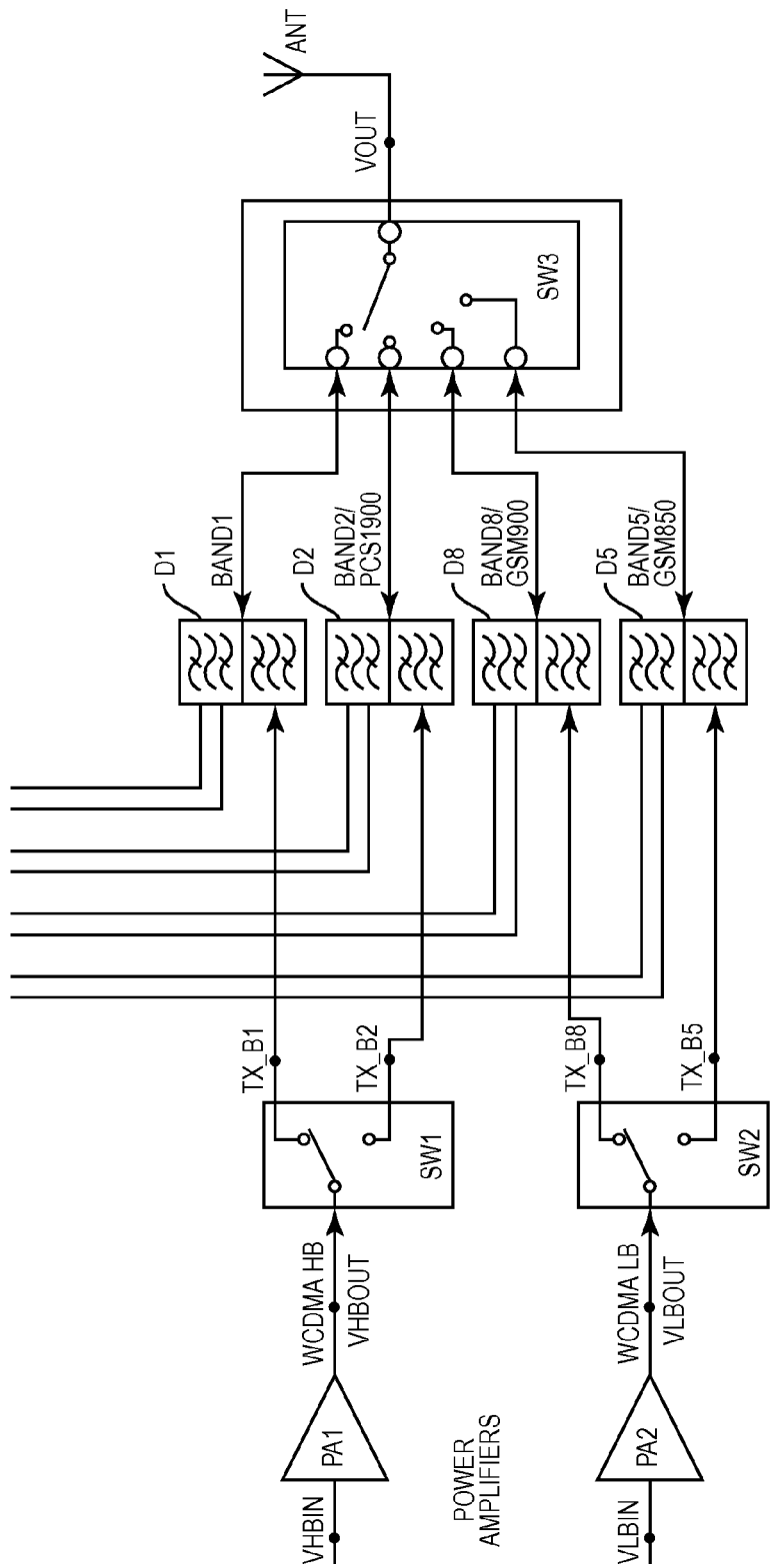
FIG. 1 illustrates a high level conventional combination of a power amplifier and a mode switch in a 3G (third generation) radiofrequency chain of a cellular handset.

Hybrid circuitry HYB performs switching and some amplification, thus allowing preamplifier PREAMP to be relatively small in comparison to the conventional power amplifier PA1 in FIG. 1. The combination circuitry COMB replaces a conventional power amplifier PA1 and a conventional mode switch SW1. The combination circuitry COMB has an input impedance Z2 matched to 50 ohms and an output impedance Z8 matched to 50 ohms.

In one embodiment, the hybrid circuitry HYB includes a first series portion Series_3 configured to amplify when ON, a first shunt portion Shunt_3, a second series portion Series_4 configured to amplify when ON, and a second shunt portion Shunt_4. In addition to some amplification, the hybrid circuitry HYB performs the switching functions conventionally performed by SW1.

Preamplifier PREAMP receives VHBIN, and outputs an intermediate signal VPRE with some small amplification; for example, outputting one watt of power at VPRE in contrast to four watts of power at VHBOUT for the conventional amplifier. In this example, the hybrid circuitry HYB must contribute three watts of power so that the output at TX_B1 is about four watts for the combination circuitry of FIG. 3, and is equivalent to four watts at TX_B1 for the conventional circuit of FIG. 2.

Specifically, preamplifier PREAMP has an input impedance Z2 of 50 ohms, an Input Matching Network N22 with a control voltage CV1, a transistor T3 with a base voltage VB3, an Interstage Matching Network N24 with a control voltage CV2, a transistor T5 with a base voltage VB5.

Hybrid circuitry HYB includes a first series portion Series_3, a first shunt portion Shunt_3, an Output Matching and Biasing Network N26 receiving a control voltage V_stack_B1, a second series portion Series_4, a second shunt portion Shunt_4, and an Output Matching and Biasing Network N28 receiving a control voltage V_stack_B2.

Figure 2:
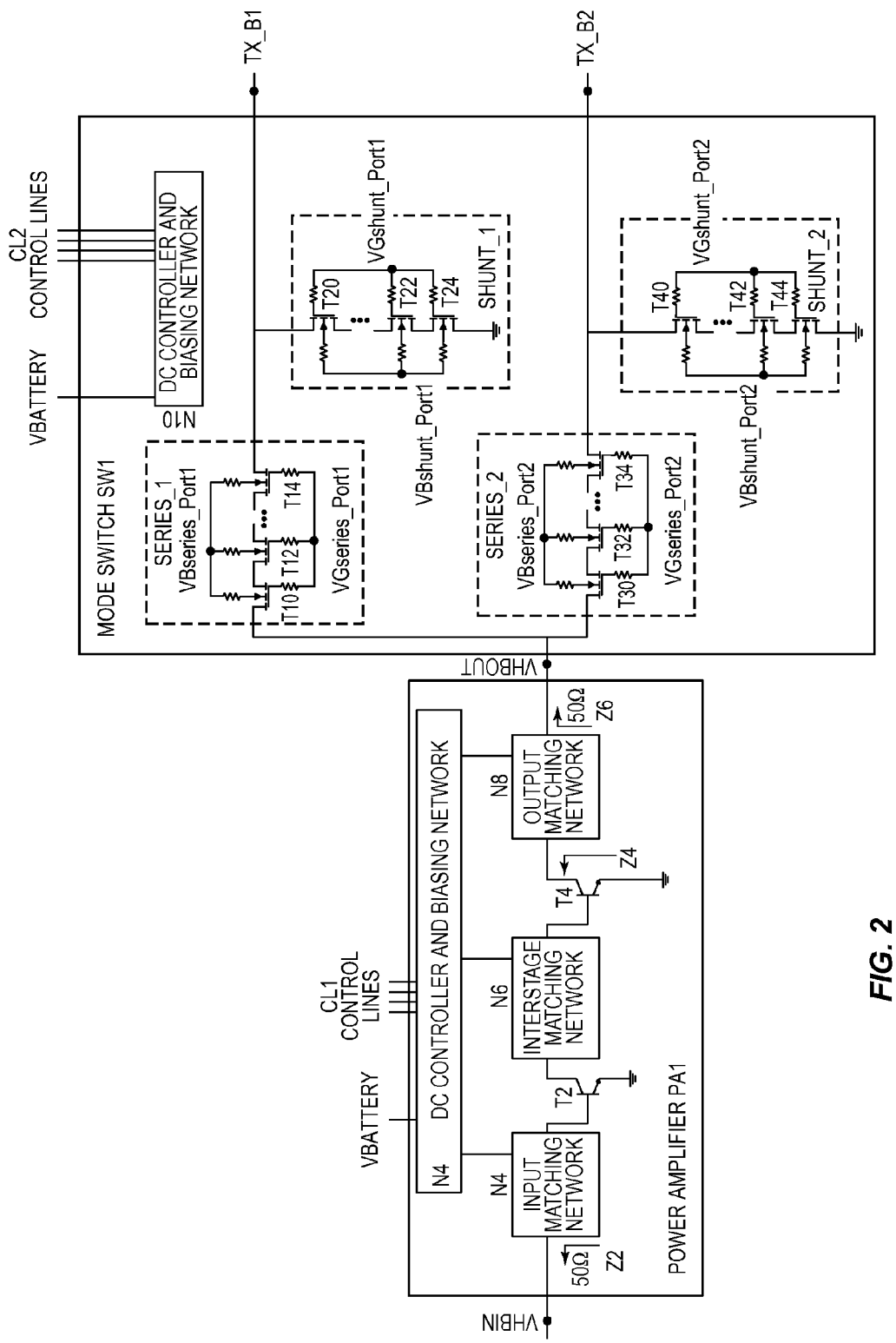
FIG. 2 illustrates a transistor level implementation of a conventional combination of a power amplifier PA1 (matched to 50 ohms) and a mode switch SW1 in a 3G (third generation) radiofrequency chain of a cellular handset.

In hybrid circuitry HYB, the first series portion Series_3, first shunt portion Shunt_3, the second series portion Series_4, and the second shunt portion Shunt_4 perform switching functions with the same logic as mode switch SW1 in FIG. 2. Additionally, hybrid circuitry HYB performs some amplification at whichever series portion is turned ON.

First series portion Series_3 receives partially amplified VPRE, and sends amplified VB1 when ON. Output Matching and Biasing Network N26 receives VB1, receives control voltage V_stack_B1, and sends TX_B1.

Second series portion Series_4 receives partially amplified VPRE, and sends amplified VB2 when ON. Output Matching and Biasing Network N28 receives VB2, receives control voltage V_stack_B2, and sends TX_B2.

In detail, the first series portion Series_3 includes: a first transistor T50 receiving a base voltage of Vbstk1; a second transistor T52 receiving a base voltage of Vbstk2, a third transistor T54 receiving a base voltage of VbstkN, a first variable impedance ZG_var1 connected to a gate of first transistor T50 and receiving a first transistor control signal Vstk1; a second variable impedance ZG_var2 connected to a gate of second transistor T52 and receiving a second transistor control signal Vstk2; and a third variable impedance ZG_varN connected to a gate of third transistor 54 and receiving a third transistor control signal VstkN.

Each transistor in first series portion Series_3 is individually controlled with three variables. For example, transistor T50 has: body voltage Vbstk1, gate impedance ZG_var1, and gate voltage Vstk1. Further, transistor T50 may be sized smaller than downstream transistor T52. Furthest downstream transistor T54 may be sized larger than all of the upstream transistors in this series (T50 and T52).

The first shunt portion Shunt_3 has three transistors (T60, T62, and T64) and is substantially identical to Shunt_1 of FIG. 2.

The second series portion Series_4 is very similar to the first series portion Series_3 discussed above. In second series portion Series_4, transistors T70, T72, and T74 receive base voltages Vbstk3, Vbst4, and VbstkM respectively. Variable impedances ZG_var3, ZG_var4, and ZG_varM are connected to the gates of transistors T70, T72, and T74 respectively, and receive control voltages Vstk3, Vstk4, and VstkM respectively.

The second shunt portion Shunt_4 has three transistors (T80, T82, and T84) and is substantially identical to Shunt_2 of FIG. 2.

As shown in FIG. 3, in one embodiment, the entire combination circuitry COMB may be fabricated monolithically in a silicon-on-SOI die, properly designed to account for all of the RF impedances and heat dissipation required in the solution. Alternatively, another embodiment may have multiple dies.

DC Controller and Biasing Network N20 receives VBATTERY, receives control lines CL3, and provides all of the necessary impedances and voltage levels at the different nodes of the many elements that comprise the combination circuitry COMB. In one embodiment, the DC controller and biasing network N20 will be a combination of digital and analog circuits (not shown) which will take input from the external control lines CL3 and then provide the required voltage/current/impedance levels necessary for proper operation.

According to what is input in the external control lines CL3, the DC controller and biasing network N20 will proceed to select the transmission path to Band 1 (TX_B1) or to Band 2 (TX_B2). More like branches may be added to provide additional amplification and switch paths for as many bands as required, in a similar manner as additional branches are added to a multithrow switch. All such variations are considered to be within the scope of the present disclosure.

Assume that the handset desires to operate in Band 1. In this case, the Band1 stacked FETs (T50, T52, and T54) in Series_3 are biased to provide a stacked common gate amplifier arrangement and therefore provide power amplification at the output of the TX_B1. The DC controller and biasing network N20 provides all of the necessary gate/body voltages to the stacked FETs in Series_3. The DC controller and biasing network N20 also provides all of the necessary gate/body voltages lower B2 branch of stacked FETs in Series_4 to turn OFF the series and hence provide the required isolation at the output of the TX_B2 terminal. If Band 2 amplification mode is desired, the controller will swap the voltages between the two branches.

As in any RF amplifier, there is a need for proper impedance matching and harmonic terminations throughout the many parts of the circuit, which may be achieved by many well established techniques. Such internal matching components are not explicitly shown in FIG. 3 since they are specific to the different bands of operation. Proper RF design practices are used to achieve the required impedances at all nodes.

Transistor T5 is a common source amplifying device, shown in FIG. 3 as a NFET transistor although it could be realized as a conventional bipolar HBT (SiGe or GaAs based) transistor. The area/periphery of this transistor T5 is much smaller than the conventional transistor T4 shown in FIG. 2. The reason this transistor T5 device is much smaller is because in this combination circuitry, power gain in this configuration is achieved by a combination of current gain from the T5 stage followed by VOLTAGE gain achieved by the stacked FETs. Because T5 is much smaller than T4, its output impedance is much higher than that of T4, and by comparison it is easier to achieve proper input matching at the output of T5. Transistor T5 operates as a common source amplifier element, whereas the stacked FET transistors (such as T50, T52, and T54) which were selected for amplification operate as common gate amplifier blocks. The other branch (such as T70, T72, and T74) operates as an OFF switch element.

In the conventional implementation shown in FIG. 2, at the output of T4, the amplifier PA1 has achieved its full rated power (for example 4 watts), and this full rated power is delivered at the input VHBOUT of the mode switch SW1. Therefore, in the conventional implementation, the switch branches (Series_1 and Series_2) have to provide enough voltage standoff to operate reliably, hence the stacking number of required series FETs in a conventional implementation is very high, typically 10 to 14 depending on the technology and the power level required.

By contrast, in the embodiment depicted in FIG. 3, at the output of T5, the voltage VPRE is much lower, on the order of 10% to 25% of the final voltage at TX_B1 when Series_3 is ON. The exact voltage level may depend on the design of the amplifier and the number of stacked devices in the stacked FET portion of the design. This is an important distinction, as the OFF branch switch requirements are much easier to achieve since the OFF branch only sees a much reduced voltage/power level at the output of T5. This is a major advantage of the combination circuitry over the conventional solution.

The DC controller and biasing network N20 may provide the necessary voltage and impedance levels throughout the entire chain of the combination circuitry. It is possible that the impedance levels may be achieved by simple resistive or capacitive voltage dividers or that more elaborate circuits may be necessary depending on the frequency of operation and power levels required. All such variations are considered to be within the scope of the present disclosure.

In FIG. 3, the transistors in the Series_3 portion are configured to be controlled individually, in order to facilitate voltage amplification. For example, each transistor (T50, T52, and T54) receives its own body control voltage (Vbstk1, Vbstk2, and Vbstk3 respectively). In one embodiment (during amplification by Series_3) these body control voltages may be −3V, −1.5V, and 0V respectively (body voltages increasing as the band 1 signal flows from left to right through the transistors and is amplified).

Further, in the Series_3 portion the gate voltages are also controlled individually, in order to facilitate voltage amplification. In one embodiment, the gate voltages Vstk1, Vstk2, and VstkN may be 1 V, 2V, and 3V respectively.

Additionally, in the Series_3 portion the variable impedances may also be individually controlled by individual control signals (not shown). These variable impedances may be mostly capacitive during voltage amplification by the Series_3 portion, and may have high impedance when the Series_3 portion is OFF (and Series_4 is amplifying).

If the hybrid circuit HYB selects the second band, then Series_3 is OFF, and Series_4 amplifies VPRE into VB2. Output Matching and Bias Network N28 receives VB2 and then outputs TX_B2.

During Series_4 amplification, the body voltages, gate voltages, and variable impedances of each transistor (T70, T72, and T74) may all be individually controlled, similar to the above discussion regarding Series_3 amplification. The individual control may be provided by DC Controller and Biasing Network N20.

Those skilled in the art will recognize improvements and modifications to the preferred embodiments of the present disclosure. All such improvements and modifications are considered within the scope of the concepts disclosed herein and the claims that follow.

What is claimed is:

1. Combination circuitry comprising:
 a preamplifier; and
 hybrid circuitry including:
  a first series portion configured to amplify upon receiving first series amplification signals,
  a first shunt portion,
  a second series portion configured to amplify upon receiving second series amplification signals, and
  a second shunt portion.

2. The combination circuitry of claim 1, wherein the preamplifier is sized to provide substantially smaller power than a conventional amplifier matched with a conventional mode switch.

3. The combination circuitry of claim 1, wherein the preamplifier is sized to provide less than half of the power of a conventional amplifier matched with a conventional mode switch.

4. The combination circuitry of claim 1, wherein the hybrid circuitry is configured to provide more amplification than the preamplifier.

5. The combination circuitry of claim 2, wherein the preamplifier includes, in series:
 an input matching network;
 a first preamplifier transistor;
 an interstage matching network; and
 a second preamplifier transistor.

6. The combination circuitry of claim 1, wherein the combination circuitry is configured to operate in a first band upon receiving first band control signals, and is configured to operate in a second band upon receiving second band control signals.

7. The combination circuitry of claim 6, further configured such that, upon receiving first band control signals:
 the first series portion amplifies;
 the first shunt portion open circuits;
 the second series portion open circuits; and
 the second shunt portion short circuits.

8. The combination circuitry of claim 7, further configured such that, upon receiving second band control signals:
 the first series portion open circuits;
 the first shunt portion short circuits;
 the second series portion amplifies; and
 the second shunt portion open circuits.

9. The combination circuitry of claim 6, wherein the first series portion comprises:
 a first transistor configured to receive a first transistor control signal; and
 a second transistor in series with the first transistor and configured to receive a second transistor control signal.

10. The combination circuitry of claim 9, wherein the first transistor control signal is controlled independently from the second transistor control signal.

11. The combination circuitry of claim 6, wherein the first series portion comprises:
 a first transistor;
 a first variable impedance in communication with a gate of the first transistor, wherein the first variable impedance is configured to receive a first transistor control signal;
 a second transistor in series with the first transistor;
 a second variable impedance in communication with a gate of the second transistor, wherein the second variable impedance is configured to receive a second transistor control signal.

12. The combination circuitry of claim 1, wherein the first series portion comprises:
 a first transistor configured to receive a first signal from the preamplifier; and
 a second transistor configured to receive an amplified first signal from the first transistor.

13. The combination circuitry of claim 12, further comprising:
 a controller and biasing network configured to send a first base control voltage to the first transistor and to send a second base control voltage to the second transistor, and
 wherein the first transistor is configured to receive the first base control voltage, and
 wherein the second transistor is configured to receive the second base control voltage.

14. The combination circuitry of claim 13, wherein second base control voltage is larger than the first base control voltage during a state when the first series portion is amplifying.

15. The combination circuitry of claim 12, further comprising:
 a biasing network configured to send a first gate control voltage to the first transistor and to send a second gate control voltage to the second transistor, and
 wherein the first transistor is configured to receive the first gate control voltage, and
 wherein the second transistor is configured to receive the second gate control voltage independently from the first gate control voltage.

16. The combination circuitry of claim 15, wherein the second gate control voltage is greater than the first gate control voltage during a state when the first series portion is amplifying.

17. The combination circuitry of claim 12, further comprising:
 a first variable impedance in communication with a gate of the first transistor and configured to receive the first gate control voltage; and
 a second variable impedance in communication with a gate of the second transistor and configured to receive the second gate control voltage independently from the first gate control voltage.

18. The combination circuitry of claim 17, wherein the first variable impedance and the second variable impedance are substantially capacitive during the state when the first series portion is amplifying.

19. The combination circuitry of claim 1,
 wherein the preamplifier includes an input matching network configured to receive an input signal and an input matching control voltage, and
 wherein the hybrid circuitry includes a first output matching and biasing network in communication with the first series portion and with the first shunt portion, and includes a second output matching and biasing network in communication with the second series portion and the second series shunt.

20. The combination circuitry of claim 19, wherein the input matching network and the first output matching and biasing network are configured to present a desired impedance to elements external to the combination circuitry during a state in which the first series portion is amplifying.

* * * * *